(12) United States Patent  
Feng et al.

(10) Patent No.: US 8,179,137 B2
(45) Date of Patent: May 15, 2012

(54) MAGNETIC RESONANCE COMPATIBLE MULTICHANNEL STRIPLINE BALUN

(75) Inventors: Limin Feng, Streetsboro, OH (US); Dan Kenrick Spence, Brookfield, WI (US); Gene Laurich, Mentor, OH (US); Aleksey Zemskov, Aurora, OH (US); Kolman Juhasz, Parma, OH (US)

(73) Assignee: General Electric Company, Schenectady, NY (US)

( * ) Notice: Subject to any disclaimer, the term of this patent is extended or adjusted under 35 U.S.C. 154(b) by 433 days.

(21) Appl. No.: 12/416,014

(22) Filed: Mar. 31, 2009

(65) Prior Publication Data
US 2010/0244977 A1 Sep. 30, 2010

(51) Int. Cl.
*G01V 3/00* (2006.01)
(52) U.S. Cl. .......................... 324/322; 324/318; 324/307
(58) Field of Classification Search .......... 324/300–322, 324/328; 600/407–435; 333/25, 26, 219–235; 336/200, 229; 382/128–131
See application file for complete search history.

(56) References Cited

U.S. PATENT DOCUMENTS

| | | | | |
|---|---|---|---|---|
| 3,459,969 | A * | 8/1969 | Jasper | 327/257 |
| 4,245,356 | A * | 1/1981 | Hallford | 455/327 |
| 4,380,829 | A * | 4/1983 | Stevenson et al. | 455/327 |
| 4,736,165 | A * | 4/1988 | Chao et al. | 330/149 |
| 4,800,393 | A | 1/1989 | Edward et al. | |
| 4,825,220 | A | 4/1989 | Edward et al. | |
| 4,978,965 | A * | 12/1990 | Mohuchy | 343/727 |
| 6,320,385 | B1 * | 11/2001 | Burl et al. | 324/322 |
| 6,407,647 | B1 * | 6/2002 | Apel et al. | 333/25 |
| 6,628,189 | B2 * | 9/2003 | Yazaki et al. | 336/200 |
| 6,727,703 | B2 | 4/2004 | Lee | |
| 6,750,652 | B2 * | 6/2004 | Weyers et al. | 324/318 |
| 6,927,575 | B2 * | 8/2005 | Burl et al. | 324/318 |
| 7,088,104 | B2 * | 8/2006 | Bottomley | 324/328 |
| 7,202,668 | B2 * | 4/2007 | Ludwig et al. | 324/318 |
| 7,215,121 | B2 | 5/2007 | Sambandamurthy et al. | |
| 7,378,851 | B1 | 5/2008 | de Rooij et al. | |
| 7,528,676 | B2 * | 5/2009 | Kearns et al. | 333/26 |
| 7,652,476 | B2 | 1/2010 | de Rooij et al. | |
| 7,714,581 | B2 * | 5/2010 | Erickson et al. | 324/322 |
| 7,795,995 | B2 * | 9/2010 | White et al. | 333/134 |
| 7,884,609 | B2 * | 2/2011 | Soutome et al. | 324/322 |
| 7,936,171 | B2 * | 5/2011 | Hu et al. | 324/322 |
| 8,013,688 | B2 * | 9/2011 | White et al. | 333/134 |
| 2002/0153988 | A1 * | 10/2002 | Yazaki et al. | 336/229 |
| 2004/0075435 | A1 * | 4/2004 | Weyers et al. | 324/318 |
| 2004/0189300 | A1 * | 9/2004 | Burl et al. | 324/318 |
| 2005/0062472 | A1 * | 3/2005 | Bottomley | 324/317 |
| 2007/0085108 | A1 * | 4/2007 | White et al. | 257/173 |

(Continued)

*Primary Examiner* — Melissa Koval
*Assistant Examiner* — Tiffany Fetzner
(74) *Attorney, Agent, or Firm* — Fletcher Yoder, PC (57) ABSTRACT

Systems and devices for transmitting radio frequency signals to and from radio frequency coils in magnetic resonance imaging systems are provided. In one embodiment, a balun for blocking induced radio frequency current on ground conductors of a multi-layer signal carrier includes first and second insulative elements disposed on first and second sides of the signal carrier, respectively, a conductive layer partially surrounding ends of each insulative element with a central region of each insulative element not surrounded by the respective conductive layer, first and second capacitive circuits coupled to the conductive layers of each respective insulative element in the central region thereof, vias extending through the signal carrier, and conductive material disposed in the vias electrically coupling a conductive layer on respective ends of the first and second elements with one another and with the ground conductors.

20 Claims, 8 Drawing Sheets

U.S. PATENT DOCUMENTS

2007/0279061 A1* 12/2007 Erickson et al. .............. 324/322
2008/0039709 A1* 2/2008 Karmarkar ................... 600/410
2008/0252393 A1* 10/2008 Kearns et al. ................. 333/26
2009/0140824 A1* 6/2009 Hu et al. ......................... 333/26
2010/0244977 A1* 9/2010 Feng et al. ..................... 333/26

* cited by examiner

MAGNETIC RESONANCE COMPATIBLE MULTICHANNEL STRIPLINE BALUN

BACKGROUND

The subject matter disclosed herein relates generally to magnetic resonance imaging systems and, more particularly, to baluns for radio frequency coils in magnetic resonance imaging systems.

Magnetic resonance imaging (MRI) systems enable imaging based on a primary magnetic field, a radio frequency (RF) pulse, and time-varying magnetic gradient fields that interact with specific nuclear components in an object, such as hydrogen nuclei in water molecules. The magnetic moments of such nuclear components may attempt to align with the primary magnetic field, but subsequently precess at a characteristic frequency known as the Larmor frequency. An RF pulse at or near the Larmor frequency of such nuclear components may cause the magnetic moments to be rotated. When the RF pulse has ended, the magnetic moments may attempt to realign with the primary magnetic field, emitting a detectable signal.

The RF pulse is produced by a radio frequency coil based on radio frequency signals received from control circuitry. The control circuitry may generally transmit the radio frequency signals across coaxial cables to the radio frequency coil. Because coaxial cables provide for unbalanced transmission while the radio frequency coil may provide for balanced transmission, a coaxial balun may transform balanced signals to unbalanced, and vice versa. However, such coaxial baluns may be relatively large and may transform signals being received from or transmitted across coaxial cables, but not other transmission means.

BRIEF DESCRIPTION

Embodiments of the presently disclosed subject matter generally relate to baluns for transforming balanced/unbalanced signals across stripline transmission lines used for controlling radio frequency coils in magnetic resonance imaging systems. In one embodiment, a balun for blocking induced radio frequency current on ground conductors of a multi-layer signal carrier includes first and second insulative elements disposed on first and second sides of the signal carrier, respectively, a conductive layer partially surrounding ends of each insulative element with a central region of each insulative element not surrounded by the respective conductive layer, first and second capacitive circuits coupled to the conductive layers of each respective insulative element in the central region thereof, vias extending through the signal carrier, and conductive material disposed in the vias electrically coupling a conductive layer on respective ends of the first and second elements with one another and with the ground conductors. The signal carrier may include, for example, two signal conductors and three ground conductors.

In another embodiment, a balun for blocking induced radio frequency current on ground conductors of a multi-layer signal carrier may include capacitive circuits disposed on first and second sides of the signal carrier, conductors disposed on first and second sides of the signal carrier and coupled to the capacitive circuits, vias extending through the signal carrier, and conductive material disposed in the vias electrically coupling the conductors on the first side of the signal carrier to conductors on the second side of the signal carrier and to the ground conductors to establish a capacitive/inductive network. The signal carrier may include alternating signal conductors and the ground conductors.

In a further embodiment, a magnetic resonance system may include a radio frequency coil to receive radio frequency emissions from a subject and to generate signals based upon the received emissions, a signal processing circuit for receiving the signals, an interface circuit between the radio frequency coil and the signal processing circuit that has alternating embedded signal conductors and ground conductors, and a balun for blocking induced radio frequency current flowing on the ground conductors in the signal carrier portion. The balun may include circuits disposed on first and second sides of the signal carrier portion, conductors disposed on first and second sides of the signal carrier portion and coupled to the capacitive circuits, vias extending through the signal carrier portion, and conductive material disposed in the vias electrically coupling the conductors on the first side of the signal carrier portion to conductors on the second side of the signal carrier portion and to the ground conductors to establish a capacitive/inductive network.

BRIEF DESCRIPTION OF THE DRAWINGS

These and other features, aspects, and advantages will become better understood when the following detailed description is read with reference to the accompanying drawings in which like characters represent like parts throughout the drawings, wherein.

DETAILED DESCRIPTION OF THE INVENTION

Figure 1:
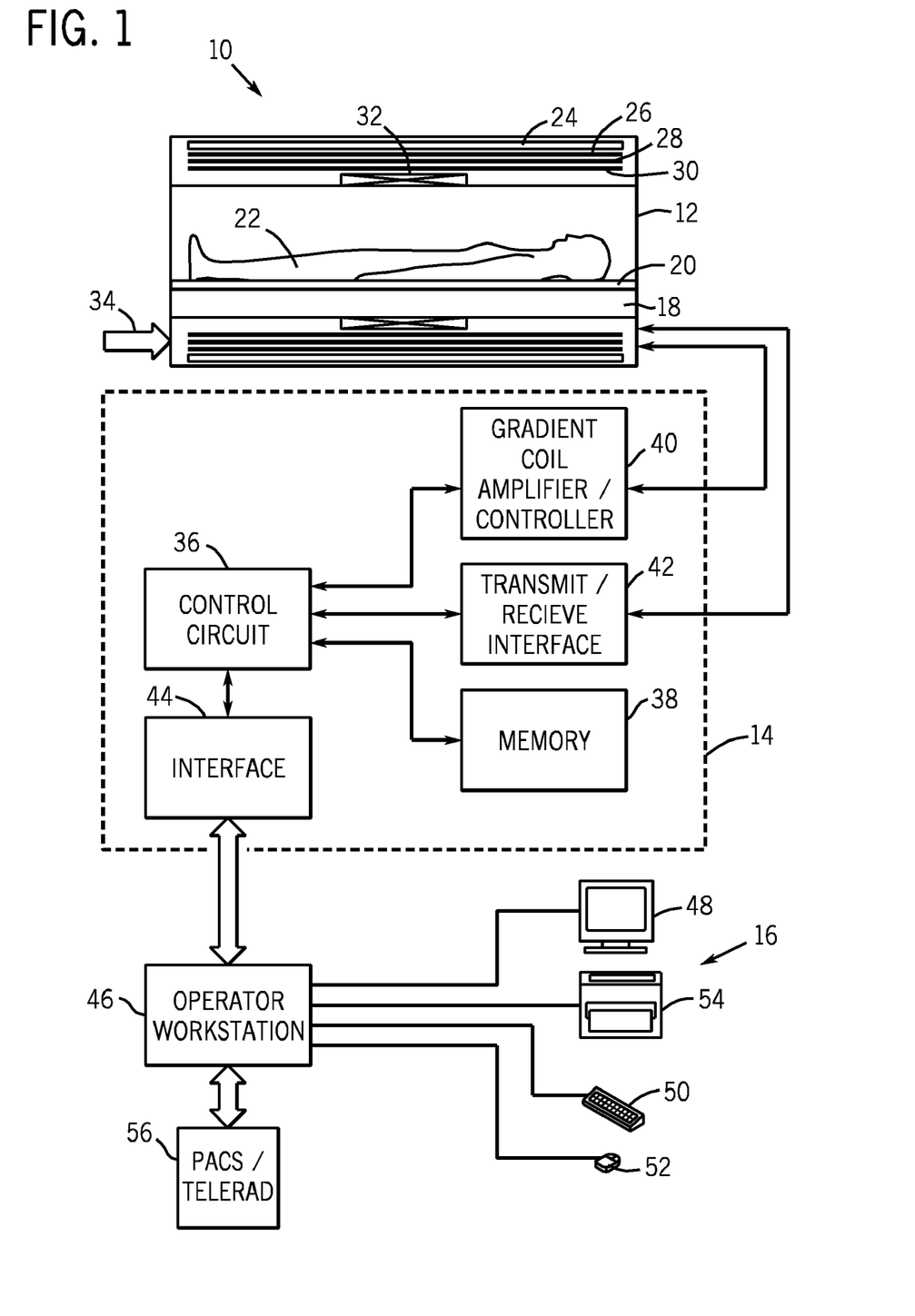
FIG. 1 is a diagrammatical representation of an embodiment of a magnetic resonance imaging (MRI) system, in accordance with aspects of the present invention.

Turning now to the drawings, and referring first to FIG. 1, a magnetic resonance imaging (MRI) system 10 is illustrated diagrammatically as including a scanner 12, scanner control circuitry 14, and system control circuitry 16. While the MRI system 10 may include any suitable MRI scanner or detector, in the illustrated embodiment the system includes a full body scanner comprising an imaging volume 18 into which a table 20 may be positioned to place a patient 22 in a desired position for scanning. The scanner 12 may additionally or alternatively be configured to target certain anatomy, such as the head or neck.

The scanner 12 may include a series of associated coils for producing controlled magnetic fields, for generating radio frequency (RF) excitation pulses, and for detecting emissions from gyromagnetic material within the patient in response to such pulses. In the diagrammatical view of FIG. 1, a main magnet 24 is provided for generating a primary magnetic field generally aligned with the imaging volume 18. A series of gradient coils 26, 28 and 30 are grouped in one or more gradient coil assemblies for generating controlled magnetic gradient fields during examination sequences as described more fully below. An RF coil 32 is provided for generating RF pulses for exciting the gyromagnetic material. Power may be supplied to the scanner 12 in any appropriate manner, as indicated generally at reference numeral 34. In the embodiment illustrated in FIG. 1, the RF coil 32 may also serve as a receiving coil. Thus, the RF coil 32 may be coupled with driving and receiving circuitry in passive and active modes for receiving emissions from the gyromagnetic material and for applying RF excitation pulses, respectively. Alternatively, various configurations of receiving coils may be provided separate from RF coil 32. Such coils may include structures specifically adapted for target anatomies, such as head coil assemblies, and so forth. Moreover, receiving coils may be provided in any suitable physical configuration, including phased array coils, and so forth.

In a present configuration, the gradient coils 26, 28, and 30 may be formed of conductive wires, bars or plates which are wound or cut to form a coil structure which generates a gradient field upon application of control pulses. The placement of the coils within the gradient coil assembly may be done in several different orders and with varying configurations, and the scanner 12 may further include complementary gradient coils (in the manner described below) to shield the gradient coils 26, 28, and 30. Generally, a z-gradient coil 26 may be positioned at an outermost location, and is formed generally as a solenoid-like structure which has relatively little impact on the RF magnetic field. The gradient coils 28 and 30 may be x-axis and y-axis coils respectively.

The gradient coils 26, 28, and 30 of the scanner 12 may be controlled by external circuitry to generate desired fields and pulses, and to read signals from the gyromagnetic material in a controlled manner. When the material, typically bound in tissues of the patient, is subjected to the primary field, individual magnetic moments of the paramagnetic nuclei in the tissue partially align with the field. While a net magnetic moment is produced in the direction of the polarizing field, the randomly oriented components of the moment in a perpendicular plane generally cancel one another. During an examination sequence, the RF coil 32 may generate an RF pulse at or near the Larmor frequency of the material of interest, resulting in rotation of the net aligned moment to produce a net transverse magnetic moment. This transverse magnetic moment precesses around the main magnetic field direction, emitting RF signals that are detected by the scanner 12 and processed for reconstruction of the desired image.

The gradient coils 26, 28, and 30 may serve to generate precisely controlled magnetic fields, the strength of which vary over a predefined field of view, typically with positive and negative polarity. When each gradient coil 26, 28, or 30 is energized with known electric current, the resulting magnetic field gradient is superimposed over the primary field and produces a desirably linear variation in the axial component of the magnetic field strength across the field of view. The field may vary linearly in one direction, but may be homogenous in the other two. The three gradient coils 26, 28, and 30 have mutually orthogonal axes for the direction of their variation, enabling a linear field gradient to be imposed in an arbitrary direction with an appropriate combination of the three gradient coils 26, 28, and 30.

The pulsed gradient fields may perform various functions integral to the imaging process. Some of these functions are slice selection, frequency encoding and phase encoding. These functions can be applied along the x-, y- and z-axes of the original coordinate system or along other axes determined by combinations of pulsed currents applied to the individual field coils.

The slice select gradient field may determine a slab of tissue or anatomy to be imaged in the patient, and may be applied simultaneously with a frequency selective RF pulse to excite a known volume of spins that may precess at the same frequency. The slice thickness may be determined by the bandwidth of the RF pulse and the gradient strength across the field of view.

The frequency encoding gradient, also known as the readout gradient, is usually applied in a direction perpendicular to the slice select gradient. In general, the frequency encoding gradient is applied before and during the formation of the MR echo signal resulting from the RF excitation. Spins of the gyromagnetic material under the influence of this gradient are frequency encoded according to their spatial position along the gradient field. By Fourier transformation, acquired signals may be analyzed to identify their location in the selected slice by virtue of the frequency encoding.

Finally, the phase encode gradient is generally applied before the readout gradient and after the slice select gradient. Localization of spins in the gyromagnetic material in the phase encode direction is accomplished by sequentially inducing variations in phase of the precessing protons of the material using slightly different gradient amplitudes that are sequentially applied during the data acquisition sequence. The phase encode gradient permits phase differences to be created among the spins of the material in accordance with their position in the phase encode direction.

A great number of variations may be devised for pulse sequences employing the exemplary gradient pulse functions described above, as well as other gradient pulse functions not explicitly described here. Moreover, adaptations in the pulse sequences may be made to appropriately orient the selected slice and the frequency and phase encoding to excite the desired material and to acquire resulting MR signals for processing.

The coils of the scanner 12 are controlled by the scanner control circuitry 14 to generate the desired magnetic field and radiofrequency pulses. In the diagrammatical view of FIG. 1, the control circuitry 14 thus includes a control circuit 36 for commanding the pulse sequences employed during the examinations, and for processing received signals. The control circuit 36 may include any suitable programmable logic device, such as a CPU or digital signal processor of a general purpose or application-specific computer. Further, the control circuit 36 may include memory circuitry 38, such as volatile and/or non-volatile memory devices for storing physical and logical axis configuration parameters, examination pulse sequence descriptions, acquired image data, programming routines, and so forth, used during the examination sequences implemented by the scanner 12.

Interface between the control circuit 36 and the coils of the scanner 12 may be managed by amplification and control circuitry 40 and by transmission and receive interface circuitry 42. The amplification and control circuitry 40 includes amplifiers for each gradient field coil 26, 28, and 30 to supply drive current in response to control signals from the control circuit 36. The receive interface circuitry 42 includes additional amplification circuitry for driving the RF coil 32. Moreover, where the RF coil 32 serves both to emit the RF excitation pulses and to receive MR signals, the receive interface circuitry 42 may include a switching device for toggling the RF coil between active or transmitting mode, and passive or receiving mode. A power supply, denoted generally by reference numeral 34 in FIG. 1, is provided for energizing the primary magnet 24. Finally, the scanner control circuitry 14 includes interface components 44 for exchanging configuration and image data with the system control circuitry 16.

The system control circuitry 16 may include a wide range of devices for facilitating interface between an operator or radiologist and the scanner 12 via the scanner control circuitry 14. In the illustrated embodiment, for example, an operator workstation 46 is provided in the form of a computer workstation employing a general purpose or application-specific computer. The operator workstation 46 also typically includes memory circuitry for storing examination pulse sequence descriptions, examination protocols, user and patient data, image data, both raw and processed, and so forth. The operator workstation 46 may further include various interface and peripheral drivers for receiving and exchanging data with local and remote devices. In the illustrated embodiment, such devices include a monitor 48, a conventional computer keyboard 50, and an alternative input device such as a mouse 52. A printer 54 is provided for generating hard copy output of documents and images reconstructed from the acquired data. In addition, the system 10 may include various local and remote image access and examination control devices, represented generally by reference numeral 56 in FIG. 1. Such devices may include picture archiving and communication systems, teleradiology systems, and the like.

Figure 2:
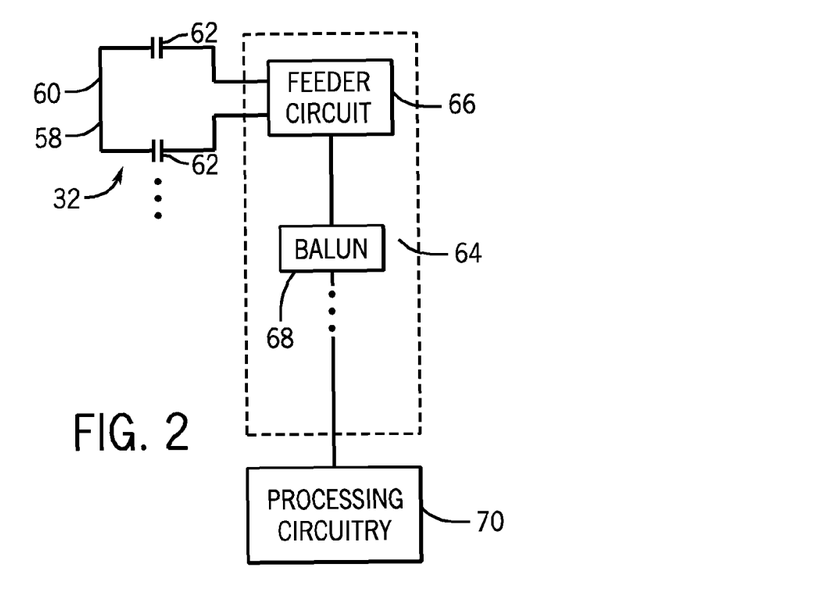
FIG. 2 is a block diagram of circuitry associated with a radio frequency (RF) coil of the MRI system of FIG. 1, in accordance with aspects of the present invention.

FIG. 2 is a block diagram of circuitry associated with the RF coil 32. The RF coil 32 may include one or more RF antennas 58 formed by a loop 60 with tuning circuitry 62, which may transmit and/or receive RF pulse signals in the scanner 12. The signals may be transmitted across an interface circuit 64 to and from the RF antennas 58 via one or more feeding circuits 66, which may also be referred to as feeder circuits 66. Each feeding circuit 66 may include, for example, a match circuit and a preamplifier.

Rather than employ coaxial cables, the feeding circuit 66 may employ stripline transmission lines, across which the RF pulse signals may be transmitted. One or more stripline baluns 68 may be located along the path of the stripline transmission lines. Described in greater detail below, the stripline baluns 68 may block induced RF current on the ground conductors of the signal carrier between of the antennas 58 and the signal processing circuitry 70 during RF excitation. The signal processing circuitry 70 may generate the signals transmitted to the RF antennas 58, as well as process the signals received by the RF antennas 58 in response.

Figure 3:
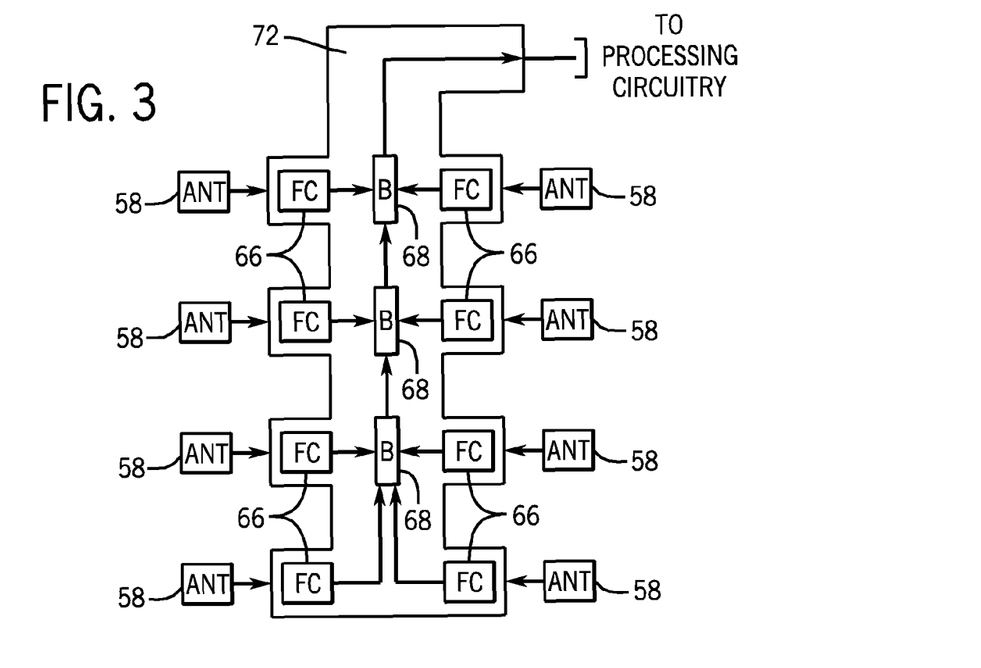
FIG. 3 is a schematic block diagram of the circuitry of FIG. 2.

FIG. 3 is a schematic block diagram of the RF coil 32 circuitry of FIG. 2. With reference to FIG. 3, the RF coil 32 may include a plurality of RF antennas 58 (e.g., 8, 16, or 32 antennas), each of which may be operably connected to a respective feeding circuit 66. The feeding circuits 66 may be disposed on a multi-layer circuit board 72 having multi-channel stripline signal paths between the RF antenna 58 and the processing circuitry 70. Thus, signals may travel across the stripline signal paths on the multi-layer circuit board 72 having, for example, an impedance of approximately 50 ohms, rather than across a coaxial cable of approximately 50 ohms. It should therefore be appreciated that signals on the signal paths may pass through one or more stripline baluns 68 between the RF antennas 58 and the processing circuitry 70, instead of through one or more coaxial cable baluns.

Figure 4:
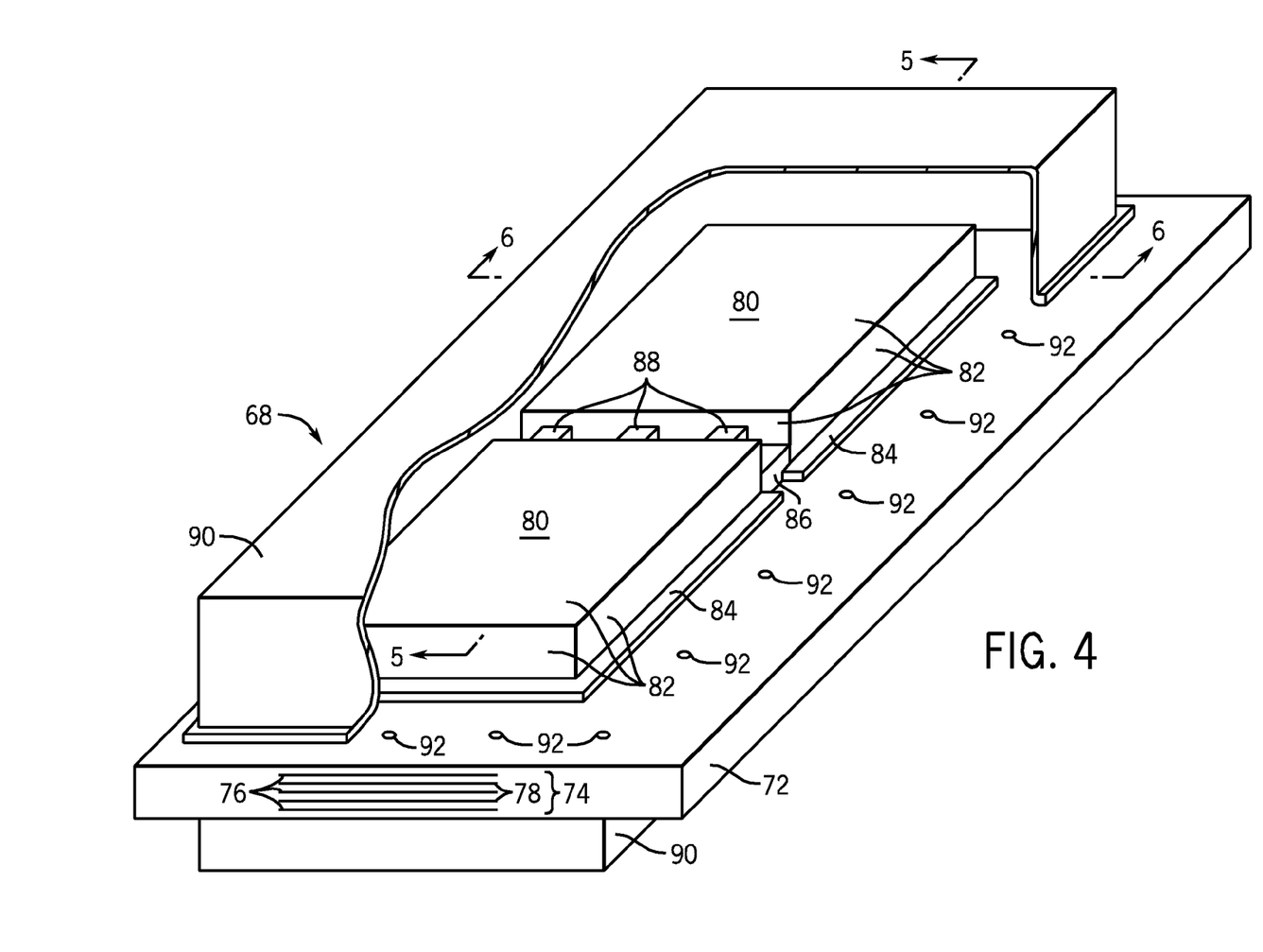
FIG. 4 is a schematic isometric depiction of an embodiment of a stripline balun of the circuitry of FIG. 2, in accordance with aspects of the present invention.

FIG. 4 is a schematic isometric depiction of one of the stripline baluns 68. The multi-channel stripline balun 68 illustrated in FIG. 4 may be disposed both above and below the multi-layer circuit board 72 to completely cover the signal paths 74. The signal paths 74 may include, for example, a plurality of stripline ground conductors 76 and one or more signal conductor layers 78. Each signal conductor layer 78 may contain multiple signal lines. The stripline balun 68 of FIG. 4 may be used in place of a coaxial cable balun to block induced ground current on the signal paths 74 and transform the signals carried by the signal paths 74 from balanced to unbalanced, and vice versa. Additionally, the stripline balun 68 may achieve a higher blocking impedance than a coaxial cable balun.

The stripline balun 68 may be formed generally on both sides of the multi-layer circuit board 72 over the signal paths 74. An outer portion of the stripline balun 68 may include two blocks 80 formed from a non-conductive, RF-permeable material (e.g., plastic) coated in a conductive layer 82 (e.g., copper). A conductive pad 84 may surround portions of each block 80 and may electrically couple the conductive layer 82 of the same block 80. The conductive layer 82 of one block 80 may be electrically separated from the conductive layer 82 of the other block 80 by a non-conductive gap 86, which may be bridged by one or more capacitive elements 88. The capacitive elements 88 may be selected based on the size and shape of the blocks 80 to achieve a desired RF frequency. Tuning the frequency of the stripline balun 68 may enable the stripline balun 68 to have maximum impedance for blocking induced RF current on the stripline ground conductors 76 of the signal paths 74 during RF excitation. To prevent the balun 68 from receiving mutual inductance from the RF antennas 58, a conductive shield 90 may completely surround the blocks 80 and be joined electrically to a corresponding shield 90 covering the other side of the stripline balun 68 through plated via holes 92.

Figure 5:
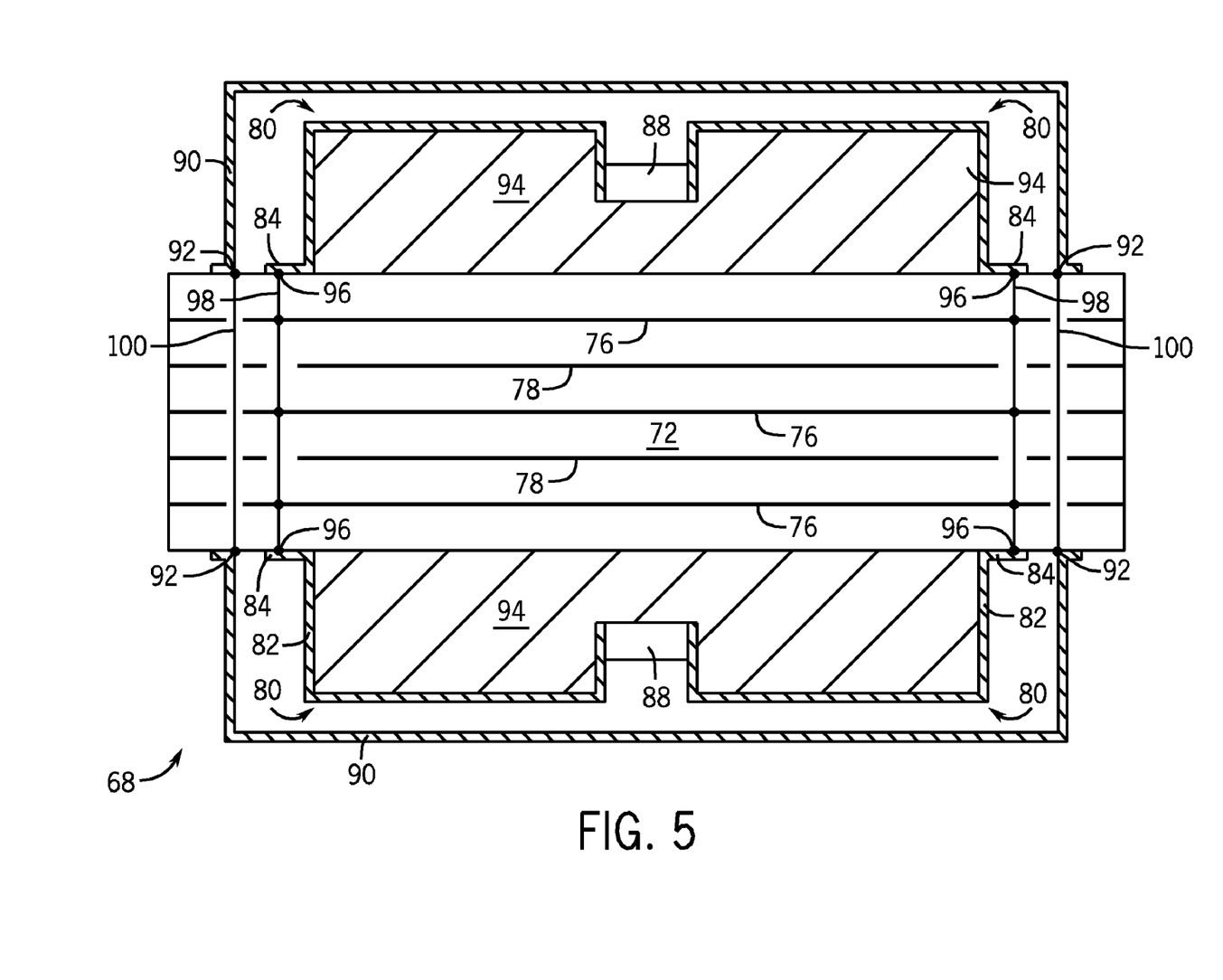
FIG. 5 is a cross-sectional view of the stripline balun of FIG. 4 across cut lines 5-5.

FIG. 5 is a cross sectional view of the stripline balun 68 of FIG. 4 from cut lines 5-5. As illustrated in FIG. 5, the stripline balun 68 may have blocks 80 formed from plastic 94. The plastic 94 may be shaped in such a way so as to create, by varying the values of capacitive elements 88, a resonant circuit of a desired frequency. As such, the stripline balun 68 may block induced RF current on the stripline ground conductors 76 on the multi-channel circuit board 72. At a point where the conductive pads 84 attach to the multi-layer circuit board 72, plated via holes 96 may enable one or more vias 98 to join to the stripline ground conductors 76 while bypassing the signal conductor layers 78. Similarly, where the conductive shield 90 is attached to the multi-layer circuit board 72, the plated via holes 92 may enable one or more vias 100 to join both sides of the conductive shields 90 surrounding the stripline balun 68. In electrically joining the two shields 90, the one or more vias 100 do not electrically couple any of the signal paths 74 to the shield 90.

Figure 6:
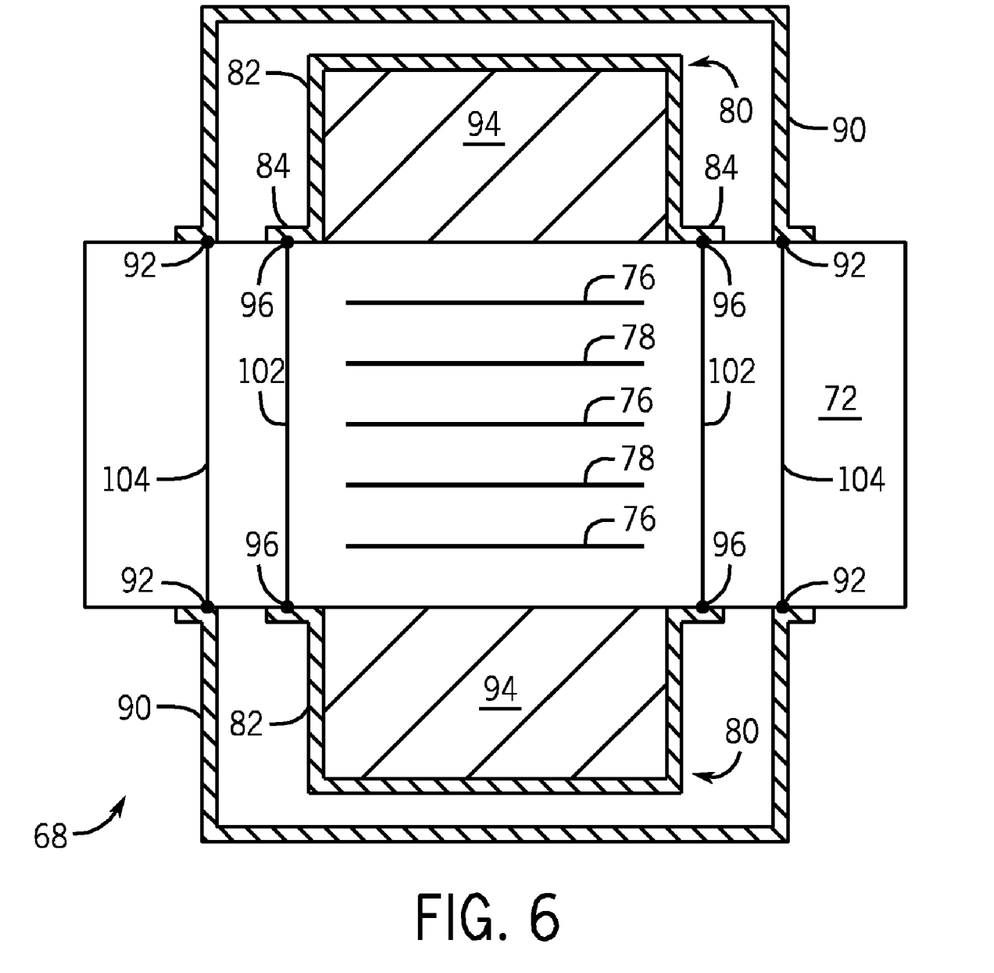
FIG. 6 is another cross-sectional view of the stripline balun of FIG. 4 across cut lines 6-6.

FIG. 6 illustrates a cross-sectional view of the balun 68 from cut lines 6-6 of FIG. 4. As shown in FIG. 6, the balun 68 may include the plated via holes 96 attached to the conducted pad 84. One or more vias 102 may pass along side the signal paths 74 but may not intersect with the stripline ground or signal carrying stripline 76 and 78. As in FIG. 5 above, the plated via holes 92 may attach the conductive shields 90 to one another by way of one or more vias 104.

Figure 7:
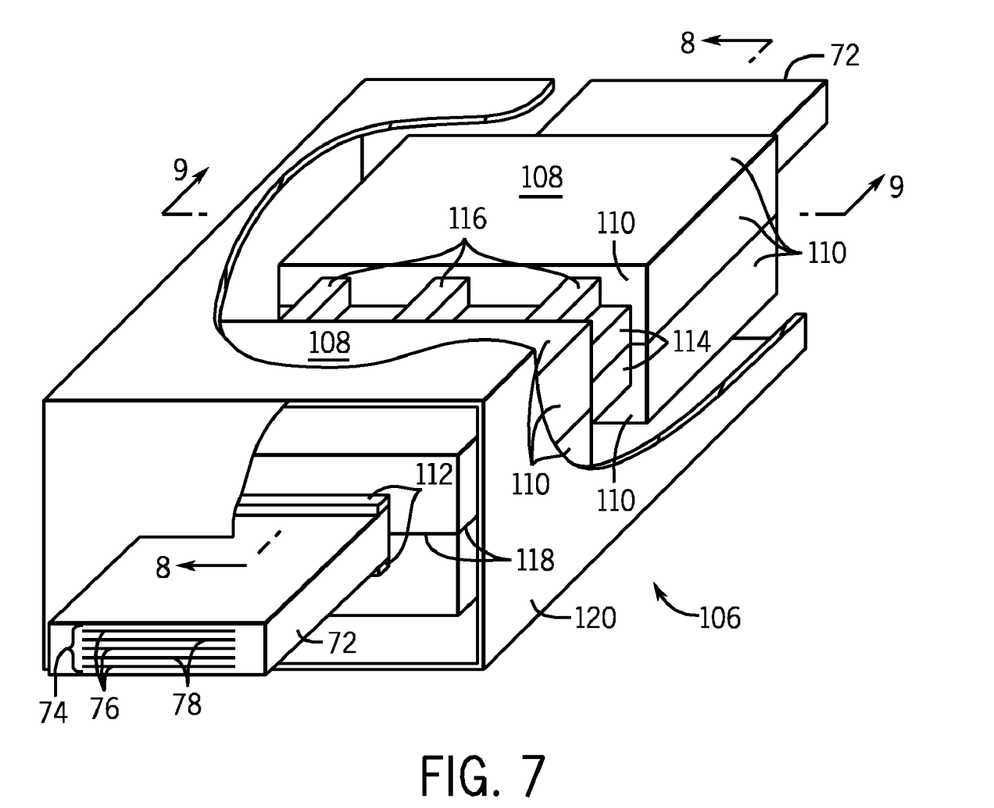
FIG. 7 is a schematic isometric depiction of another embodiment of a stripline balun of the circuitry of FIG. 2, in accordance with aspects of the present invention.
Figure 8:
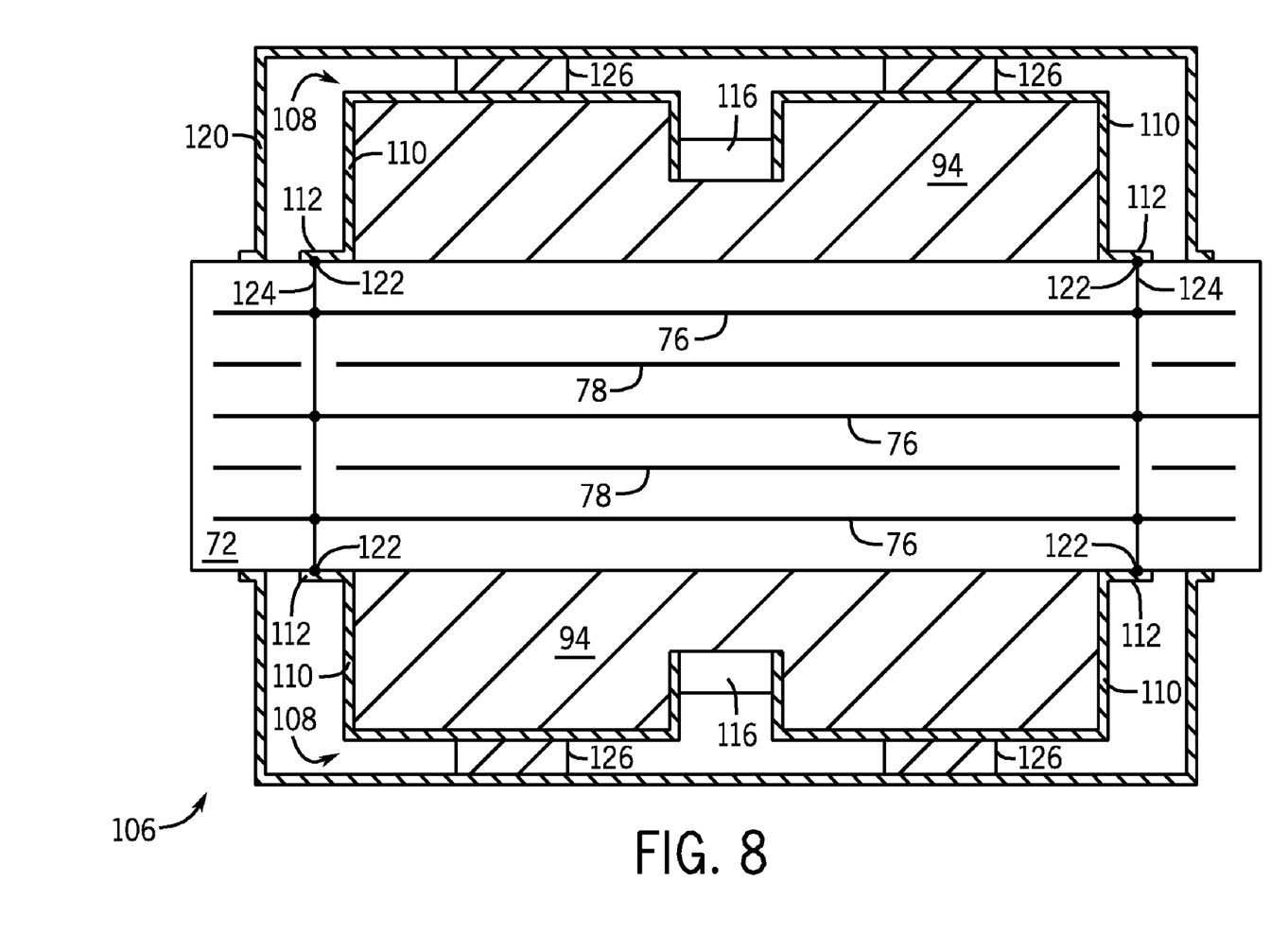
FIG. 8 is a cross-sectional view of the stripline balun of FIG. 7 across cut lines 8-8.
Figure 9:
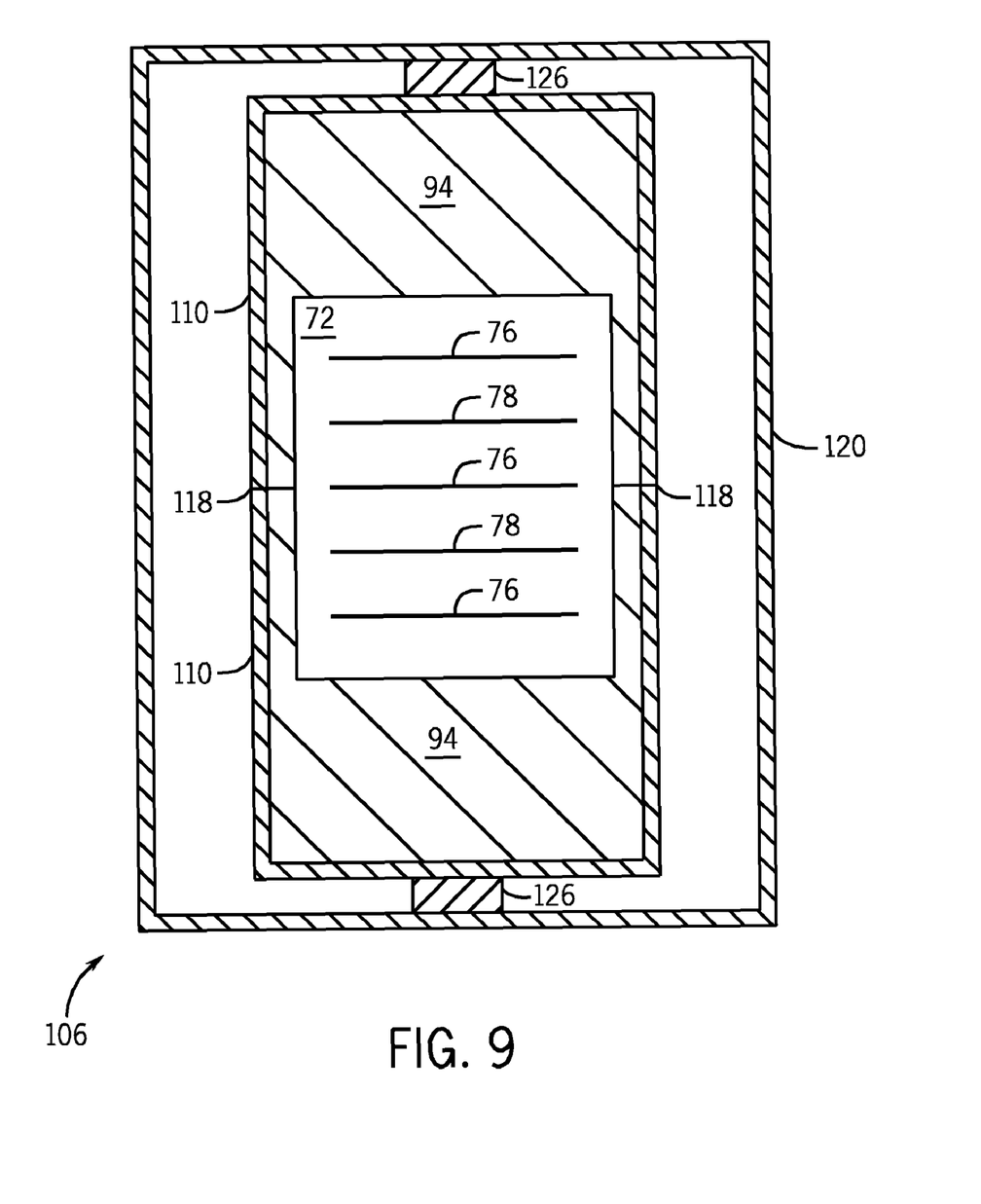
FIG. 9 is cross-sectional view of the stripline balun of FIG. 7 across cut lines 9-9.

FIGS. 7-9 depict an alternative embodiment of the stripline balun 68, illustrated in FIGS. 7-9 as a stripline balun 106. The embodiment of the stripline balun 106 of FIGS. 7-9 may function in substantially the same manner as the stripline balun 68 of FIGS. 4-6, but may completely surround the multi-layer circuit board 72. FIG. 7 is a schematic isometric illustration of the stripline balun 106. The multi-channel stripline balun 68 of FIG. 7 may completely surround the multi-layer circuit board 72 and the signal paths 74 within. As described above, signal paths 74 may include, for example, the plurality of stripline ground conductors 76 and the one or more signal conductor layers 78. The stripline balun 106 of FIG. 7 may be used in place of a coaxial balun to filter interference from the signal paths 74, and may achieve a higher blocking impedance than a coaxial cable balun.

The stripline balun 106 may be formed generally around the multi-layer circuit board 72 over the signal paths 74. An outer portion of the stripline balun 106 may include blocks 108 formed from a non-conductive, RF-permeable material (e.g., plastic) coated in a conductive layer 110 (e.g., copper). A conductive pad 112 may surround portions of each block 108 where the block 108 attaches to the multi-layer circuit board 72. The conductive layer 110 of one block 108 may be electrically separated from the conductive layer 110 of the other block 108 by a non-conductive gap 114, which may be bridged by one or more capacitive elements 116; each block 108 may be joined an upper and lower portion of itself via conductive block joints 118. The capacitive elements 116 may be selected based on the size and shape of the blocks 108 to achieve a desired blocking frequency. It should be appreciated that tuning the impedance of the stripline balun 106 may enable the stripline balun 106 to filter interference on the signal paths 74 that may arise, for example, from external sources of electromagnetic radiation. To prevent the balun 106 from receiving mutual inductance from the RF antennas 58, a conductive shield 120 may completely surround the stripline balun 106.

FIG. 8 is a cross sectional view of the stripline balun 106 of FIG. 7 from cut lines 8-8. As illustrated in FIG. 8, the stripline balun 106 may have blocks 108 formed from plastic 94. The plastic 94 may be shaped so as to create a resonant circuit of a desired frequency when the values of the capacitive elements 116 are tuned. As such, the stripline balun 106 may block induced RF current on the stripline ground conductors 76 on the multi-channel circuit board 72. At a point where the conductive pads 112 attach to the multi-layer circuit board 72, plated via holes 122 may enable one or more vias 124 to join to the stripline ground conductors 76 while bypassing the signal conductor layers 78. Because the conductive shield 120 surrounds the multi-layer circuit board 72, no plated via holes may join the two sides of the conductive shield 120.

FIG. 9 illustrates a cross-sectional view of the balun 106 from cut lines 9-9 of FIG. 7. Unlike the stripline balun 68 of FIGS. 4-6, the conductive layers 110 of the stripline balun 106 may join by way of the block joints 118 instead of by way of vias through the multi-layer circuit board 72. The one or more non-conductive shims 126 may separate the conductive shield 120 and the conductive layer 110.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A balun capable of operating in a magnetic resonance imaging system, the balun configured to block induced radio frequency current on ground conductors of a stripline multi-layer signal carrier without requiring conversion into or out of a coaxial cable, the multi-layer signal carrier including alternating signal conductors and the ground conductors, the balun comprising:

first and second insulative elements disposed on first and second sides of the multi-layer signal carrier, respectively;

a conductive layer partially coating an exterior of each insulative element, wherein the conductive layer does not coat a central region of each insulative element substantially transverse to a direction of the multi-layer signal carrier, such that each insulative element comprises a first conductively coated region and a second conductively coated region separated from one another by the central region that is not conductively coated, wherein the central region is substantially equidistant to an entrance of the multi-layer signal carrier into the balun and an exit of the multi-layer signal carrier out of the balun;

first and second capacitive circuits respectively coupling the first and second conductively coated regions of each respective insulative element across the central regions thereof;

vias extending through the multi-layer signal carrier; and conductive material disposed in the vias electrically coupling the first conductively coated regions of the insulative elements with the ground conductors around the entrance of the multi-layer signal carrier into the balun and the second conductively coated regions of the insulative elements with the ground conductors around the exit of the multi-layer signal carrier out of the balun.

2. The balun of claim 1, wherein the multi-layer signal carrier includes two signal conductors and three ground conductors, the signal conductors being disposed between pairs of the ground conductors.

3. The balun of claim 1, wherein the capacitive circuits tune the balun to the Larmor frequency.

4. The balun of claim 1, comprising conductive pads disposed on the first and second sides of the multi-layer signal carrier, and wherein the conductive layers are electrically coupled to the conductive pads.

5. The balun of claim 1, comprising a conductive shield spaced from and at least partially surrounding the conductive layers.

6. The balun of claim 5, wherein the shield is electrically contiguous around the first and second sides of the multi-layer signal carrier.

7. The balun of claim 6, wherein the multi-layer signal carrier includes additional vias and conductive material disposed in the additional vias for electrically coupling a first shield element on the first side of the multi-layer signal carrier with a second shield element on the second side of the multi-layer signal carrier.

8. A balun capable of operating in a magnetic resonance imaging system, the balun configured to block induced radio frequency current on ground conductors of a stripline multi-layer signal carrier without requiring conversion into or out of a coaxial cable, the multi-layer signal carrier including alternating signal conductors and the ground conductors, the balun comprising:

capacitive circuits disposed on first and second sides of the multi-layer signal carrier;

at least four conductors, a first and second of the conductors disposed on the first side of the multi-layer signal carrier and coupled to one another via at least one of the capacitive circuits, and a third and fourth of the conductors disposed on the second side of the multi-layer signal carrier and coupled to one another via at least one other of the capacitive circuits, wherein the first and third of the conductors are generally disposed near an entrance of the multi-layer signal carrier to the balun and the second and fourth of the conductors is generally disposed near an exit of the multi-layer signal carrier from the balun;

vias extending through the multi-layer signal carrier; and conductive material disposed in the vias electrically coupling the first and second conductors on the first side of the signal carrier respectively to the third and fourth conductors on the second side of the multi-layer signal carrier and to the ground conductors to establish a capacitive/inductive network.

9. The balun of claim 8, wherein the conductors disposed on the first side of the multi-layer signal carrier have the same dimensions as the conductors disposed on the second side of the multi-layer signal carrier.

10. The balun of claim 8, wherein the first and second conductors have substantially equal dimensions to one another, such that the first conductor is a mirror image of the second conductor.

11. The balun of claim 8, wherein the first and second conductors have unequal dimensions relative to one another.

12. The balun of claim 8, wherein the conductors comprise conductive layers covering a portion of five respective faces of each of four nonconductive rectangular blocks.

13. The balun of claim 12, wherein the four nonconductive rectangular blocks comprise a nonconductive plastic.

14. The balun of claim 8, comprising a conductive shield surrounding the conductors and electrically separated from the conductors, the conductive shield being configured to block inductance to the conductors from an external source.

15. A magnetic resonance system comprising:

a radio frequency coil configured to receive radio frequency emissions from a subject and to generate signals based upon the received emissions;

a signal processing circuit for receiving the signals;

an interface circuit disposed between the radio frequency coil and the signal processing circuit, the interface circuit comprising a stripline multi-layer signal carrier portion having alternating embedded signal conductors and ground conductors; and a balun configured to block induced radio frequency current flowing on the ground conductors in the multi-layer signal carrier portion without requiring conversion into or out of a coaxial cable, the balun including capacitive circuits disposed on first and second sides of the multi-layer signal carrier portion, at least four conductors disposed on first and second sides of the multi-layer signal carrier portion, two conductors on each side being coupled to opposite sides of the capacitive circuits such that the multi-layer signal carrier passes beneath or above a first of the two conductors before passing beneath or above a second of the two conductors, vias extending through the multi-layer signal carrier portion, and conductive material disposed in the vias electrically coupling the two conductors on the first side of the multi-layer signal carrier portion to the two respective conductors on the second side of the multi-layer signal carrier portion and to the ground conductors to establish a capacitive/inductive network.

16. The system of claim 15, wherein the interface circuit includes a plurality of feeding circuits disposed along the signal carrier portion.

17. The system of claim 16, comprising a plurality of similar baluns disposed along the multi-layer signal carrier portion intermediate the feeding circuits.

18. The system of claim 16, wherein the feeding circuits and the multi-layer signal carrier portion are provided on a single multi-layer circuit board, portions of which form the signal carrier portion.

19. The system of claim 16, wherein the radio frequency coil comprises a plurality of antennas configured to receive a respective plurality of signals from the plurality of feeding circuits.

20. The system of claim 15, wherein the multi-layer signal carrier portion is configured to carry radio frequency signals.

* * * * *